United States Patent [19]
Ahrens

[11] Patent Number: 5,465,055
[45] Date of Patent: Nov. 7, 1995

[54] RAM-LOGIC TILE FOR FIELD PROGRAMMABLE GATE ARRAYS

[75] Inventor: Michael G. Ahrens, Sunnyvale, Calif.

[73] Assignee: Crosspoint Solutions, Inc., Santa Clara, Calif.

[21] Appl. No.: 325,714

[22] Filed: Oct. 19, 1994

[51] Int. Cl.⁶ .................................................. H03R 19/177
[52] U.S. Cl. ............................... 326/41; 326/44; 326/113
[58] Field of Search .................................. 326/37–39, 41, 326/44, 45, 49, 50, 113

[56] References Cited

U.S. PATENT DOCUMENTS

| | | |
|---|---|---|
| 4,495,629 | 6/1985 | Zazio et al. . |
| 4,591,993 | 5/1986 | Griffin et al. . |
| 4,609,830 | 9/1986 | Brandman . |
| 4,642,487 | 2/1987 | Carter . |
| 4,644,187 | 2/1987 | Haji . |
| 4,682,202 | 7/1987 | Tanizawa . |
| 4,689,654 | 8/1987 | Brockmann . |
| 4,745,307 | 5/1988 | Kitamura et al. . |
| 4,758,745 | 7/1988 | Elgamel et al. . |
| 4,786,904 | 11/1988 | Graham, III et al. . |
| 4,837,461 | 6/1989 | Kubosawa et al. . |
| 4,853,562 | 8/1989 | Yamada . |
| 4,857,774 | 8/1989 | El-Ayat et al. . |
| 4,870,302 | 9/1989 | Freeman . |
| 4,873,459 | 10/1989 | El Gamal et al. . |
| 4,910,417 | 3/1990 | El Gamal et al. . |
| 4,933,576 | 6/1990 | Tamamura et al. . |
| 4,935,734 | 6/1990 | Austin . |
| 5,001,368 | 3/1991 | Cliff et al. . |
| 5,015,885 | 5/1991 | El Gamal et al. . |
| 5,083,083 | 1/1992 | El-Ayat et al. . |
| 5,166,556 | 11/1992 | Hsu et al. . |
| 5,172,014 | 12/1992 | El Ayat et al. . |
| 5,187,393 | 2/1993 | El Gamal et al. . |
| 5,200,907 | 4/1993 | Tran .................................... 326/38 X |
| 5,313,119 | 5/1994 | Cooke et al. . |
| 5,317,209 | 5/1994 | Garverick et al. ................ 326/39 |
| 5,327,023 | 7/1994 | Kawana et al. ................... 326/39 |

Primary Examiner—David R. Hudspeth
Attorney, Agent, or Firm—Townsend and Townsend and Crew

[57] ABSTRACT

An improved RAM-logic tile (RLT) for use in a field programmable gate array (FPGA) is presented. The RLTs are located at the intersection of global horizontal and vertical lines. Wiring segments run locally between RLTs and contain programmable antifuses for connecting segments within an RLT and to neighboring RLTs. The RLTs are implemented with transmission gates and can be efficiently configured into a memory structure and/or logic device.

16 Claims, 6 Drawing Sheets

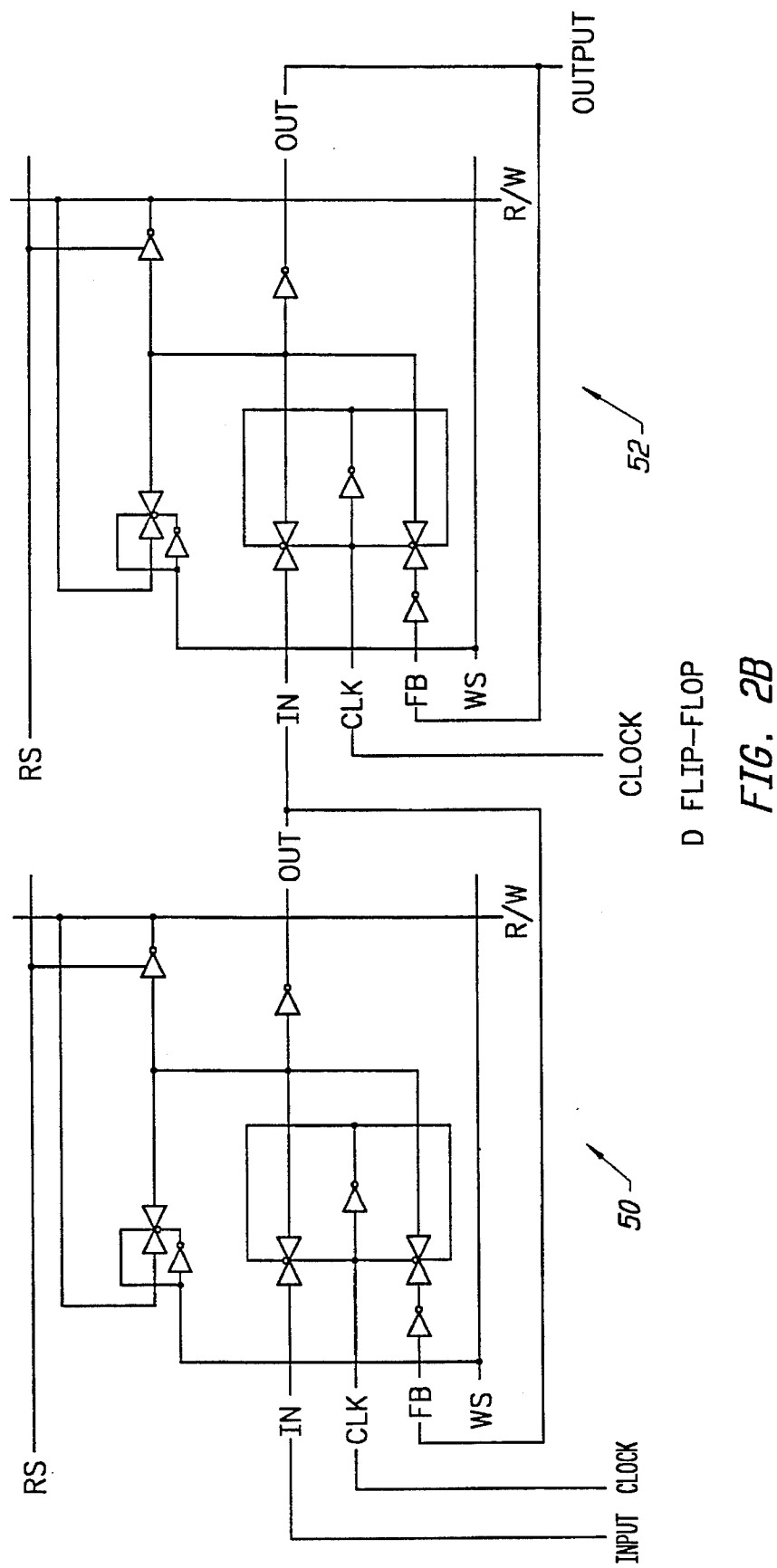
FIG. 2B  D FLIP-FLOP

RAM-LOGIC TILE FOR FIELD PROGRAMMABLE GATE ARRAYS

BACKGROUND OF THE INVENTION

The invention relates generally to the field of semiconductor devices and, more particularly, to RAM-logic tiles for use in field programmable gate arrays.

A gate array, a type of integrated circuit device, is a large two-dimensional matrix of logic blocks, each of which is typically equivalent to one or a few logic gates. These logic blocks are overlaid with one or more interconnection layers, which connect the logic blocks in a pattern to perform a user-specified function.

A type of gate array, the field programmable gate array (FPGA), is formed with a global set of vertical and horizontal wiring lines and a local set of wiring segments built into the device. The wiring segments are electrically isolated from the logic blocks and each other by electrically programmable interconnect elements. One such element is an antifuse. The user programs these antifuses to define the specified interconnection pattern for the user's application, very rapidly and at the user's own facility.

However, traditional FPGAs have had the problem that their operation may be relatively slow as compared to other types of gate arrays. One solution to this problem is the FPGA disclosed in U.S. Pat. No. 5,313,119, issued May 17, 1994 to L. H. Cooke et al., and assigned to the present assignee. The specification of which is hereby incorporated by reference for all purposes.

The present invention provides an integrated circuit RAM-logic tile (RLT) that is designed to efficiently implement both memory structures and sequential logic elements. The RLTs of the present invention provide substantial speed advantages over RLTs heretofore known. An embodiment of the RLT according to the present invention is a drop-in replacement for the latch-logic blocks of the FPGA disclosed in U.S. Pat. No. 5,313,119, previously incorporated by reference.

SUMMARY OF THE INVENTION

A FPGA is typically composed of horizontal and vertical global lines. At the intersection of the horizontal and vertical global lines are discrete logic blocks or RLTs. In addition, the RLTs are connected to horizontal and vertical intersecting wiring segments. At the intersection of the wiring segments are antifuses, which when programmed, electrically connect the intersecting wiring segments. Through antifuse programming, the RLTs can be used to implement memory structures and logic functions.

In order to program an antifuse, the two intersecting wiring segments for a particular antifuse are driven to large programming voltages. The large voltage breaks down the material across the antifuse and changes the antifuse from a high resistance state to a low resistance state.

By programming the antifuses, the RLTs can implement NAND logic gates, EXCLUSIVE-OR (XOR) logic gates, multiplexers, latches, flip-flops, and adders. In addition, the RLT rows can be used to assemble moderately sized static random access memory (RAM) arrays.

The RLTs of the present invention utilize transmission gates to implement memory structures and various logic functions. The RLTs according to the present invention provide extremely efficient logic blocks for a FPGA. Additionally, an embodiment of the present invention provides high flexibility as it may be configured as a memory structure and a logic device at the same time.

BRIEF DESCRIPTION OF THE DRAWINGS

FIG. 2A illustrates how an RLT may be configured as an EXCLUSIVE-OR logic gate and FIG. 2B illustrates how two RLTs may be configured as a D flip-flop.

DESCRIPTION OF THE PREFERRED EMBODIMENT(S)

The RLTs according to the present invention utilize transmission gates. A transmission gate (hereinafter "T-gate") is a circuit composed of an NMOS transistor and a PMOS transistor connected in parallel. Thus, the T-gate has an NMOS and a PMOS gate. Signals of opposite polarity are applied to the transistor gates such that both devices turn off and on together. When both devices are turned on, a signal may pass through the T-gate. Although T-gates are bidirectional, the T-gates in the present invention will be described as having an input and an output for simplicity.

RLT with Three Global Lines

Figure 1:
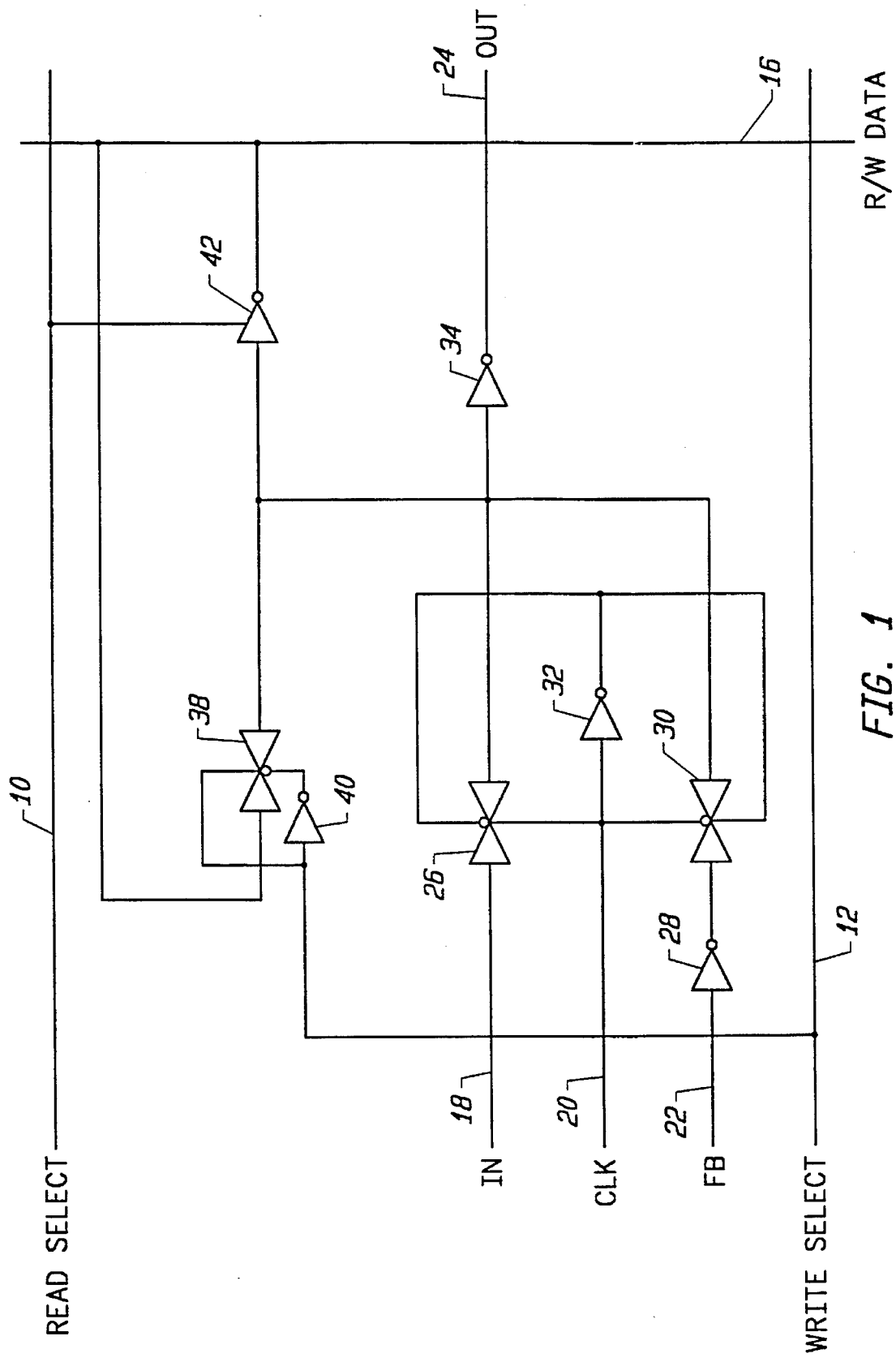
FIG. 1 is a logic circuit schematic of an embodiment of an RLT according to the present invention.

A schematic of an embodiment of an RLT according to the present invention is illustrated in FIG. 1. The RLT has three global lines: two horizontal and one vertical. The two horizontal lines are Read Select line 10 and Write Select line 12. The vertical line is Read/Write (R/W) Data line 16. These three global lines are used to control an RLT configured as a memory structure. The Read Select and Write Select lines are input and the R/W Data line is bidirectional.

There are four wiring segments associated with the RLT shown in FIG. 1. Three of the wiring segments are input: IN segment 18, Clock (CLK) segment 20, and Feedback (FB) segment 22. The other wiring segment, OUT segment 24, is output. The wiring segments may be connected through antifuse programming either locally within the RLT or to adjacent RLTs or to other logic units within the FPGA.

Still referring to FIG. 1, IN segment 18 is connected to the input of a T-gate 26 and FB segment 22 is connected through an inverter 28 to the input of a T-gate 30. CLK segment 20 is connected to the MOS gates of T-gates 26 and 30 such that it acts as a control input for a 2-to-1 multiplexer of the IN segment and the inverted FB segment. The CLK segment is connected to the NMOS gate of T-gate 26 and the PMOS gate of T-gate 30. The CLK segment is also connected to an inverter 32, the output of which is connected to the PMOS gate of T-gate 26 and the NMOS gate of T-gate 30. The output from T-gates 26 and 30 are connected to an inverter 34. The output from inverter 34 is OUT segment 24. Thus, if the CLK segment is a logic "high", the IN segment is selected, whereas if the CLK segment is a logic "low", the inverted FB segment is selected.

Write Select line 12 is connected to the NMOS gate of a T-gate 38. The Write Select line is also connected to the PMOS gate of T-gate 38 through an inverter 40. R/W Data line 16 is connected to the input of T-gate 38. The output of T-gate 38 is connected to the input of a tri-state output 42. In addition, the output of T-gates 26 and 30 are connected to the input of tri-state output 42. Read Select line 10 is the enabling input for tri-state output 42. The output of tri-state output 42 is connected to R/W Data line 16.

The RLT shown in FIG. 1 is functionally a 2-to-1 multiplexer of the FB segment and an inverted IN segment, with the CLK segment being the input control signal. If the CLK segment is "high", T-gate 26 is turned on, T-gate 30 is turned off, and the IN segment is selected; however, inverter 34 causes an inverted IN segment to be delivered to the OUT segment. On the other hand, if the CLK segment is "low", T-gate 30 is turned on, T-gate 26 is turned off, and the FB segment is selected. As the FB segment passes through inverters 28 and 34, the OUT segment represents the FB segment. Therefore, the RLT is functionally a 2-to-1 multiplexer with the inverted IN segment and the FB segment as inputs, the CLK segment as the control input, and the OUT segment being the output.

Figure 2A:
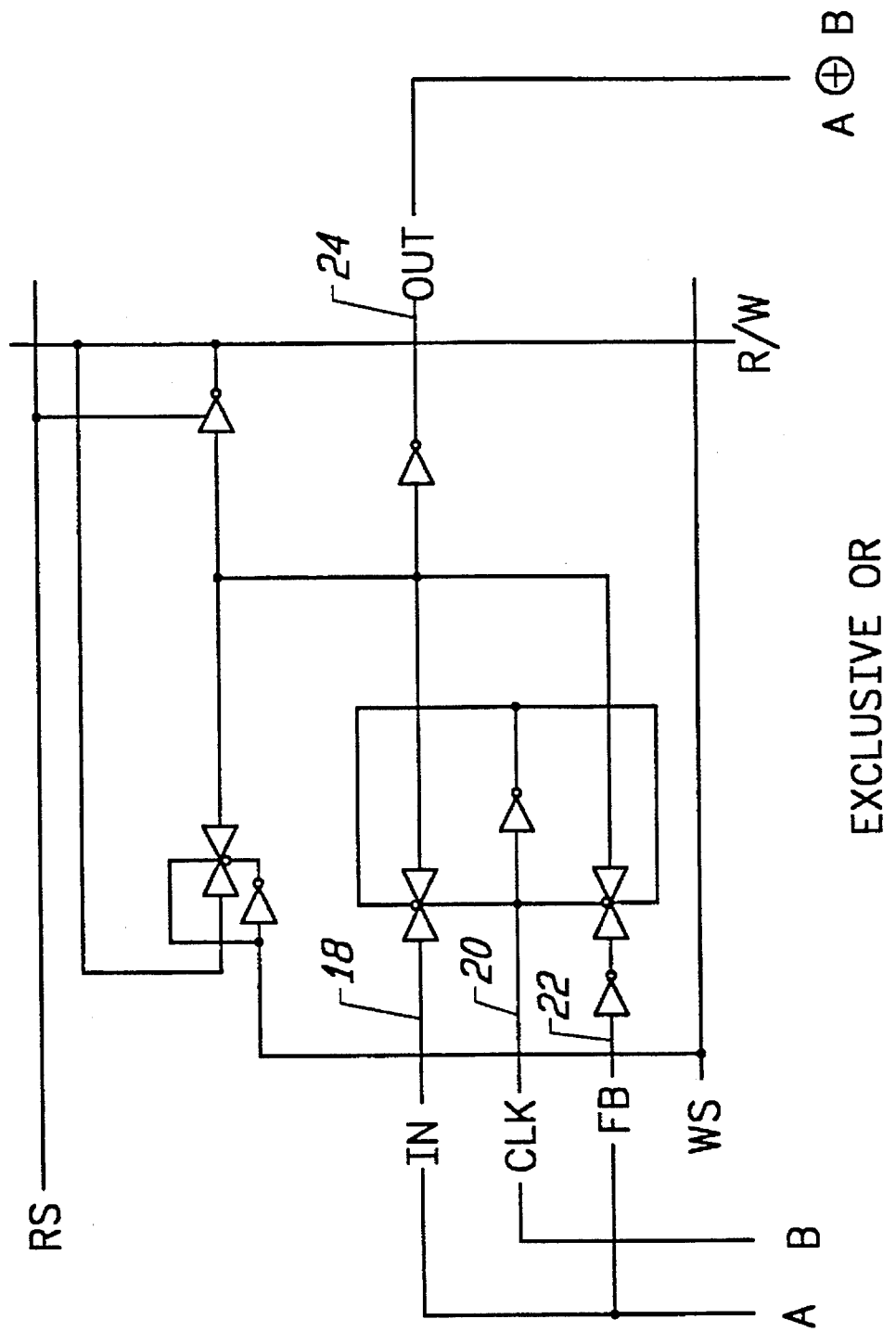

The RLT shown in FIG. 2A is configured to operate as an EXCLUSIVE-OR (XOR) logic gate. An input A and an input B are shown. In order to configure the RLT to output the XOR of A and B, the IN segment and the FB segment are connected by antifuse programming to form a node. Input A is connect to the node and input B is connected to the CLK segment. When the RLT is configured in this way, the OUT segment will represent the XOR of the inputs A and B.

FIG. 2B illustrates how two neighboring RLTs can be configured into a D flip-flop. The IN segment of a first RLT 50 is the input terminal of the flip-flop. The OUT segment of the first RLT is connected to the FB segment of the first RLT. The OUT segment of the first RLT is also connected to the IN segment of a second RLT 52. The OUT segment of the second RLT is connected to the FB segment of the second RLT. The CLK segments of both RLTs are connected to the clock signal of the flip-flop. The output terminal of the flip-flop is connected to the OUT and FB segments of the second RLT as shown.

Figure 3:
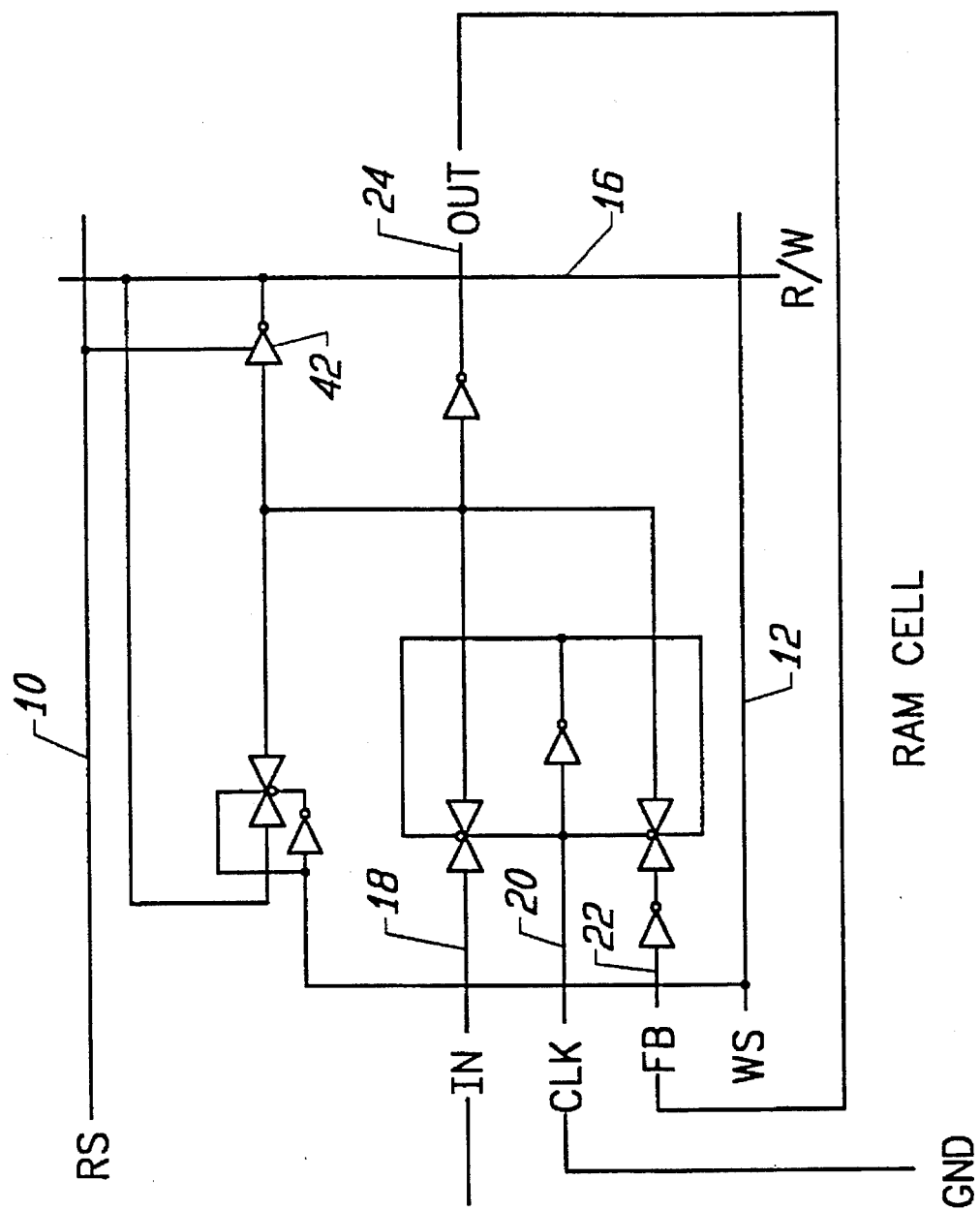
FIG. 3 illustrates the configuration of an RLT as a single-port static RAM cell.

An RLT according to the present invention can be configured to be a single-port static RAM cell through antifuse programming as shown in FIG. 3. OUT segment 24 is connected to FB segment 22. Additionally, CLK segment 20 is connected to ground so that T-gate 30 is turned on and T-gate 26 is turned off. In this manner, the logic state is stored in the cell by the feedback action of the OUT segment and the FB segment. This weak latch will be referenced by the Read Select and Write Select lines.

In operation, the configured RAM cell is read by a control signal on the Read Select line to enable tri-state output 42. The logic state stored in the weak latch then appears on the R/W Data line. To write the RAM cell, the data signal to be stored is placed on the R/W Data line. When the Write Select line of the RAM cell is "high", the data enters the cell through T-gate 38 and is latched in the cell when the Write Select line returns to "low".

RLT with Four Global Lines

Figure 4:
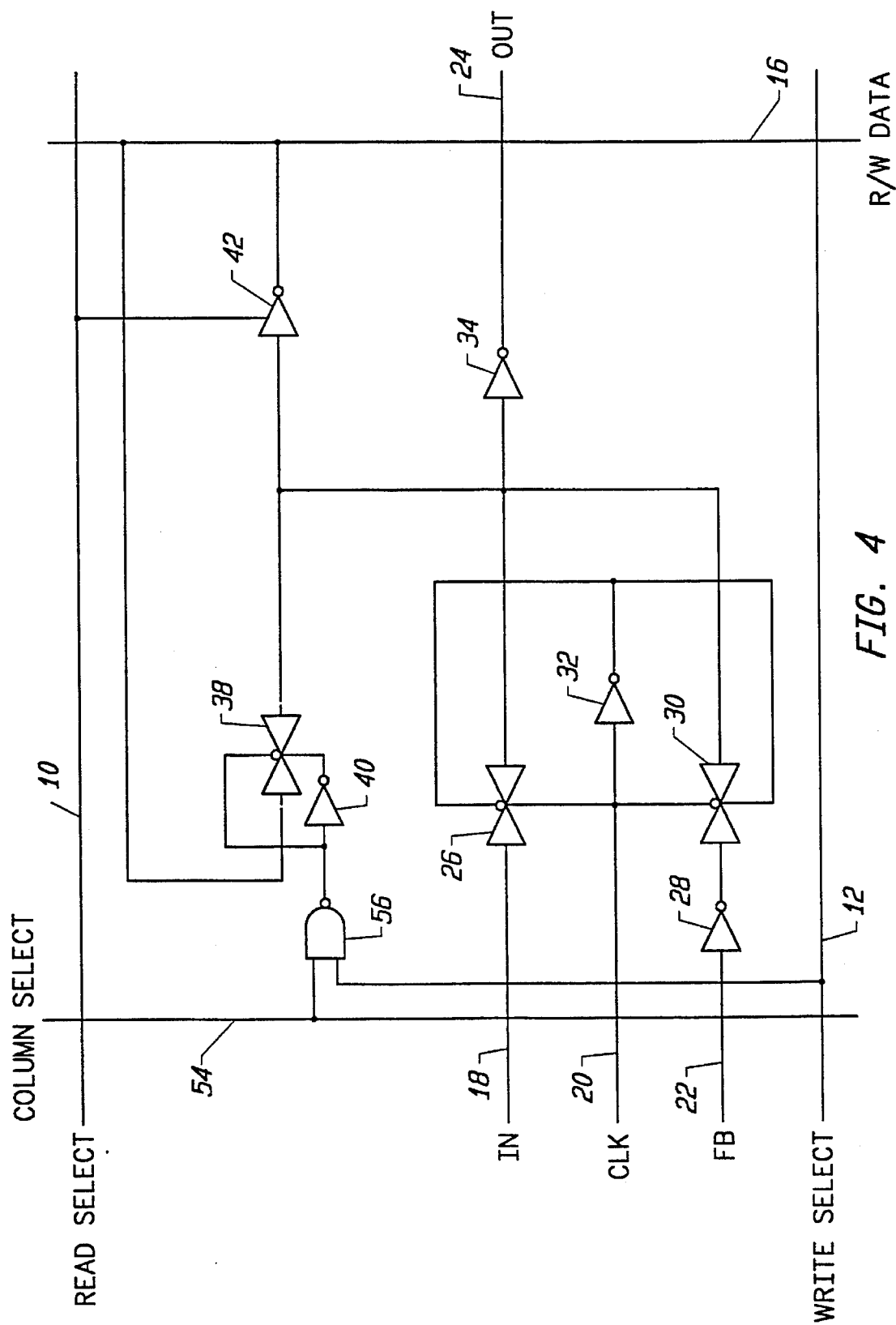
FIG. 4 is a logic circuit schematic of an embodiment of an RLT according to the present invention.

A schematic of an embodiment of an RLT according to the present invention is illustrated in FIG. 4. The same reference numerals have been used in FIG. 4 for the corresponding structures in FIG. 1. The RLT in this embodiment has four global lines. The additional global line is a vertical line, Column Select 54. The additional global line is used to implement a column addressable RAM structure.

Write Select line 12 and Column Select line 54 are inputs to a NAND gate 56. The output from NAND gate 56 is connected to the PMOS gate of a T-gate 38. The output from NAND gate 36 is also connected to the NMOS gate of T-gate 38 through inverter 40. The polarity of the gates of T-gate 38 have been reversed to account for the inversion of the signal produced by NAND gate 56. The RLT shown in FIG. 4 can be configured as a logic device as described earlier.

Additionally, the RLT can function as a column addressable, single-port static RAM cell. The RLT is configured in the same way as described in reference to FIG. 3 (i.e., the CLK segment connected to ground and the OUT segment connected to the FB segment). In operation, the configured RAM cell is read by a control signal on the Read Select line to enable tri-state output 42. The logic state stored in the weak latch then appears on the R/W Data line. To write the RAM cell, the data signal to be stored is placed on the R/W Data line. When the Write Select and Column Select lines of the RAM cell are both "high", the data enters the cell through T-gate 38 and is latched in the cell when one of the Write Select and Column Select lines return to "low".

In FIG. 4, the Column Select line is only used during write operations. However, it could be easily modified to select bits during a read operation by connecting the Column Select and Read Select lines an AND gate or its equivalent before tri-state output 42.

Dual Function RLT

Figure 5:
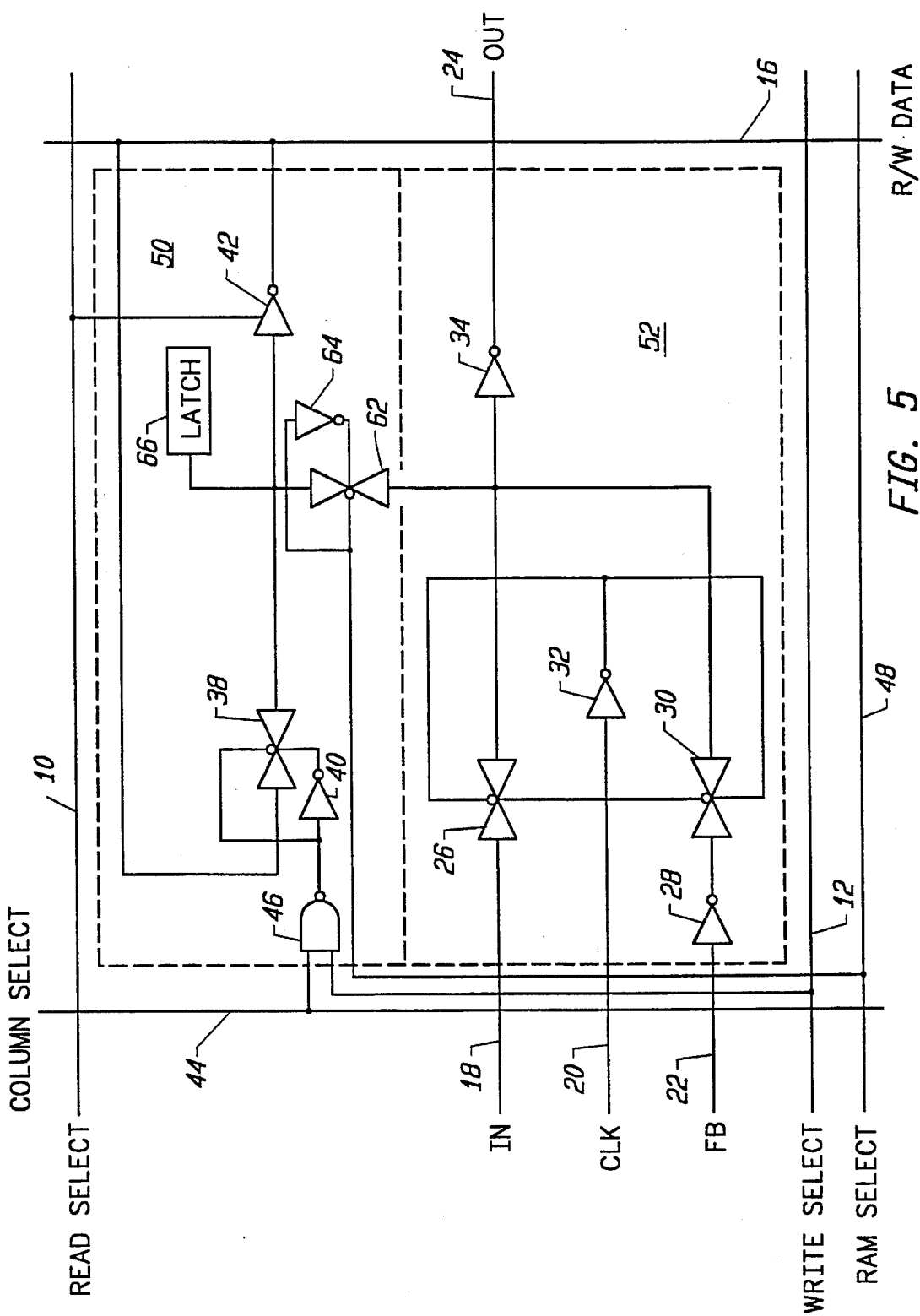
FIG. 5 is a logic circuit schematic of an embodiment of an RLT according to the present invention.

A schematic of another embodiment of an RLT according to the present invention is illustrated in FIG. 5. This embodiment is very similar to the previous embodiments except that the RLT of this embodiment can function as a memory device and a logic device at the same time. The same reference numerals have been used in FIG. 5 for the corresponding structures in FIG. 4. The RLT in this embodiment has five global lines. The additional global line is a horizontal line, RAM Select line 48. The additional global line is used to isolate a RAM portion 50 from a logic portion 52 of the RLT so that the RLT can simultaneously operate as a memory structure and a logic device.

RAM Select line 48 is connected to the PMOS gate of a T-gate 62. The RAM Select line is also connected to the NMOS gate of T-gate 62 through an inverter 64. T-gate 62 is placed between the input of inverter 34 and the input of tri-state output 42. In addition, a weak latch 66 is connected to the input of the tri-state output. The weak latch is used to store the logic state of the memory structure of the RLT when the RLT is operating as a memory structure and a logic device simultaneously.

When the RAM line is "low", the RLT will function as an RLT with four global lines. However, if the RAM line is set to "high", the T-gate 62 is disabled which isolates RAM portion 50 from logic portion 52. The logic portion may be configured into different logic devices through antifuse programming. The RAM portion will function as a column addressable, single-port static RAM cell. Weak latch 66 is necessary to hold the logic state in the RAM cell since the logic portion is not available to perform this function. During operation, the RAM Select line may be pulled "low" to bring the bit stored in the RAM portion to the logic portion.

Conclusion

While the above is a complete description of the preferred embodiments of the invention, various alternatives, modifications and equivalents may be used. It should be evident that the present invention is equally applicable by making appropriate modifications to the embodiments described above. For example, the RAM Select line of the Dual Function RLT may be implemented as a local wing segment instead of a global line. Therefore, the above description should not be taken as limiting the scope of the invention which is defined by the metes and bounds of the appended claims.

What is claimed is:

1. In a field programmable gate array having a plurality of conducting lines in a first direction and a plurality of conducting lines in a second direction perpendicular to said first direction; an array of circuit blocks located at the intersections of said first and second direction conducting lines and connected to said conducting lines; and a plurality of wiring segments connecting said circuit blocks, said wiring segments interconnectable through programmable antifuses so that each block is configured to perform a memory function or a logic function; each of said circuit blocks comprising:

five input terminals, said first, second and third input terminals each connected to one of said wiring segments and said fourth and fifth input terminals each connected to one of two said first direction conducting lines;

a bidirectional terminal coupled to a second direction conducting line;

an output terminal coupled to a wiring segment;

a multiplexer having first and second inputs, a control input, and an output, said first input being coupled to said first input terminal, said second input being coupled to said second input terminal, said control input being coupled to said third input terminal, and said output coupled to said output terminal through an output node;

a transmission gate, responsive to said fourth input terminal, coupled to said bidirectional terminal and to said output node; and a tri-state output, responsive to said fifth input terminal, having an input and an output, said input coupled to said output node and said output coupled to said bidirectional terminal.

2. The circuit block of claim 1 wherein said multiplexer comprises:

a first transmission gate, responsive to said control input, coupled to said first multiplexer input and to said multiplexer output; and a second transmission gate, responsive to the inverse of said control input, coupled to said second multiplexer input and to said multiplexer output.

3. The circuit block of claim 2 further comprising an inverter between said second input terminal and said second multiplexer input.

4. The circuit block of claim 1 further comprising an inverter between said output node and said output terminal.

5. The circuit block of claim 1 wherein said tri-state output further includes an inverter.

6. The circuit block of claim 1 wherein said transmission gate is further responsive to a sixth input terminal coupled to a second direction conducting line.

7. The circuit block of claim 6 further comprising a NAND gate having as input said fourth and sixth input terminals and output controllably coupled to said transmission gate.

8. In a field programmable gate array having a plurality of conducting lines in a first direction and a plurality of conducting lines in a second direction perpendicular to said first direction; an array of circuit blocks located at the intersections of said first and second direction conducting lines and connected to said conducting lines; and a plurality of wiring segments connecting said circuit blocks, said wiring segments interconnectable through programmable antifuses so that each block is configured to perform a memory function and/or a logic function; each of said circuit blocks comprising:

six input terminals, said first, second and third input terminals each connected to one of said wiring segments and said fourth and fifth input terminals each connected to one of two said first direction conducting lines;

a bidirectional terminal coupled to a second direction conducting line;

an output terminal coupled to a wiring segment;

a multiplexer having first and second inputs, a control input, and an output, said first input being coupled to said first input terminal, said second input being coupled to said second input terminal, said control input being coupled to said third input terminal, and said output coupled to said output terminal through a first node;

a first transmission gate, responsive to said input terminal, coupled to said bidirectional terminal and to a second node;

a tri-state output, responsive to said fifth input terminal, having an input and an output, said input coupled to said second node and said output coupled to said bidirectional terminal;

a second transmission gate, responsive to said sixth input terminal, coupled to said first node and said second node; and a latch coupled to said second node.

9. The circuit block of claim 8 wherein said sixth input terminal is coupled to a first direction conducting line.

10. The circuit block of claim 8 wherein said sixth input terminal is coupled to a wiring segment.

11. The circuit block of claim 8 wherein said multiplexer comprises:

a first transmission gate, responsive to said control input, coupled to said first multiplexer input and to said multiplexer output; and a second transmission gate, responsive to the inverse of said control input, coupled to said second multiplexer input and to said multiplexer output.

12. The circuit block of claim 11 further comprising an inverter between said second input terminal and said second multiplexer input.

13. The circuit block of claim 8 further comprising an inverter between said first node and said output terminal.

14. The circuit block of claim 8 wherein said tri-state output further includes an inverter.

15. The circuit block of claim 8 wherein said first transmission gate is further responsive to a seventh input terminal coupled to a second direction conducting line.

16. The circuit block of claim 15 further comprising a NAND gate having as input said fourth and seventh input terminals and output controllably coupled to said first transmission gate.

* * * * *